(12) United States Patent
Ichiki et al.

(10) Patent No.: US 12,464,694 B2
(45) Date of Patent: Nov. 4, 2025

(54) ELECTROMAGNETIC SHIELDING MEMBER

(71) Applicant: FUJIFILM Corporation, Tokyo (JP)

(72) Inventors: Takahiko Ichiki, Kanagawa (JP); Tokuju Oikawa, Kanagawa (JP); Hideki Yasuda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 775 days.

(21) Appl. No.: 17/806,691

(22) Filed: Jun. 13, 2022

(65) Prior Publication Data

US 2022/0312656 A1    Sep. 29, 2022

Related U.S. Application Data

(63) Continuation of application No. PCT/JP2020/046950, filed on Dec. 16, 2020.

(30) Foreign Application Priority Data

Dec. 25, 2019 (JP) .................. 2019-234011
Jun. 2, 2020 (JP) .................. 2020-096055

(51) Int. Cl.
*H05K 9/00* (2006.01)

(52) U.S. Cl.
CPC .......... *H05K 9/0088* (2013.01); *H05K 9/009* (2013.01)

(58) Field of Classification Search
CPC ............. B23K 26/342; B23K 26/034; B23K 26/0626; B23K 26/0665; B23K 26/144; B23K 26/354; B23K 26/702; B22F 10/28; B22F 10/368; B22F 12/222; B22F 12/41; B22F 12/49; B22F 10/25; B22F 12/226; B22F 12/53; B22F 12/90; B22F 2007/068; B22F 10/64; B33Y 10/00; B33Y 30/00; B33Y 50/00; B33Y 50/02; G05B 19/4099; Y02P 10/25
See application file for complete search history.

(56) References Cited

U.S. PATENT DOCUMENTS

| 2004/0200821 A1 | 10/2004 | Voeltzel |
| 2009/0027300 A1 | 1/2009 | Kudo et al. |
| 2010/0156695 A1 | 6/2010 | Sim et al. |
| 2016/0231417 A1 | 8/2016 | Aoki et al. |

(Continued)

FOREIGN PATENT DOCUMENTS

| GB | 2 452 665 A | 3/2009 |
| JP | H06-169288 A | 6/1994 |

(Continued)

OTHER PUBLICATIONS

"Notice of Reasons for Refusal" Office Action issued in JP 2021-567338; mailed by the Japanese Patent Office on Jul. 18, 2023.

(Continued)

*Primary Examiner* — Robert G Bachner
(74) *Attorney, Agent, or Firm* — Studebaker Brackett PLLC

(57) ABSTRACT

An electromagnetic shielding member (11) includes a substrate (12) having a three-dimensional shape, and a conductive layer member (13) that is disposed on the substrate (12) and reflects an electromagnetic wave in a wavelength-selective manner.

19 Claims, 7 Drawing Sheets

(56) References Cited

U.S. PATENT DOCUMENTS

| | | | |
|---|---|---|---|
| 2016/0241690 A1 | 8/2016 | Sim et al. | |
| 2018/0132390 A1* | 5/2018 | Jeong | H05K 1/095 |
| 2019/0160801 A1* | 5/2019 | Wang | B32B 38/10 |
| 2021/0129495 A1 | 5/2021 | Asai et al. | |

FOREIGN PATENT DOCUMENTS

| | | |
|---|---|---|
| JP | 2000-013088 A | 1/2000 |
| JP | 2001-345632 A | 12/2001 |
| JP | 2003-258483 A | 9/2003 |
| JP | 2003-318593 A | 11/2003 |
| JP | 2006-526944 A | 11/2006 |
| JP | 2007-336415 A | 12/2007 |
| JP | 2008-035232 A | 2/2008 |
| JP | 2008-227351 A | 9/2008 |
| JP | 2010-003964 A | 1/2010 |
| JP | 2012-146823 A | 8/2012 |
| JP | 2016-145777 A | 8/2016 |
| JP | 2018-088479 A | 6/2018 |
| JP | 2019-016491 A | 1/2019 |
| WO | 2019/189042 A1 | 10/2019 |

OTHER PUBLICATIONS

"Decision of Refusal" Office Action issued in JP 2021-567338; mailed by the Japanese Patent Office on Dec. 12, 2023.

International Preliminary Report On Patentability (Chapter I) and Written Opinion of the International Searching Authority issued in PCT/JP2020/046950; issued Jun. 28, 2022.

International Search Report issued in PCT/JP2020/046950; mailed Mar. 23, 2021.

An Office Action mailed by China National Intellectual Property Administration on Dec. 24, 2024, which corresponds to Chinese Patent Application No. 202080089288.8 and is related to U.S. Appl. No. 17/806,691; with English language translation.

The extended European search report issued by the European Patent Office on Apr. 18, 2023, which corresponds to European Patent Application No. 20906452.6-1205 and is related to U.S. Appl. No. 17/806,691.

An Office Action mailed by China National Intellectual Property Administration on Jun. 25, 2025, which corresponds to Chinese Patent Application No. 202080089288.8 and is related to U.S. Appl. No. 17/806,691; with English language translation.

* cited by examiner

ELECTROMAGNETIC SHIELDING MEMBER

CROSS-REFERENCE TO RELATED APPLICATIONS

This application is a Continuation of PCT International Application No. PCT/JP2020/046950 filed on Dec. 16, 2020, which claims priority under 35 U.S.C. § 119(a) to Japanese Patent Application No. 2019-234011 filed on Dec. 25, 2019 and Japanese Patent Application No. 2020-096055 filed on Jun. 2, 2020. Each of the above applications is hereby expressly incorporated by reference, in its entirety, into the present application.

BACKGROUND OF THE INVENTION

1. Field of the Invention

The present invention relates to an electromagnetic shielding member reflecting an electromagnetic wave having a specific wavelength.

2. Description of the Related Art

In recent years, an electromagnetic shielding member that reflects an electromagnetic wave having a specific wavelength is used, for example, in order to prevent communication crosstalk of the electromagnetic waves received or transmitted by each sensor in a case in which a module including a plurality of sensors is constructed, and to prevent leakage of a communication wave and improve the security of the communication. For example, JP2007-336415A discloses an electromagnetic shielding member that has a planar shape and reflects an electromagnetic wave having a specific wavelength.

SUMMARY OF THE INVENTION

By the way, in recent years, there is an increasing demand for selectively reflecting only the electromagnetic wave having the specific wavelength to a three-dimensional object in addition to the member having a planar shape. However, the electromagnetic shielding member disclosed in JP2007-336415A is applied to the member having a planar shape, and there is no electromagnetic shielding member that reflects the electromagnetic wave to the three-dimensional object in a wavelength-selective manner.

The present invention is to solve such a problem and is to provide an electromagnetic shielding member capable of reflecting an electromagnetic wave to a three-dimensional object in a wavelength-selective manner.

In order to achieve the above object, an aspect of the present invention relates to an electromagnetic shielding member comprising a substrate having a three-dimensional shape, and a conductive layer member that is disposed on the substrate and reflects an electromagnetic wave in a wavelength-selective manner.

The conductive layer member may consist of a first conductive layer on which a selective transmission pattern portion that selectively transmits an electromagnetic wave having a specific wavelength range is formed.

Alternately, the conductive layer member may consist of a second conductive layer on which a selective reflection pattern portion that selectively reflects an electromagnetic wave having a specific wavelength range is formed.

Alternately, the conductive layer member may consist of a first conductive layer on which a selective transmission pattern portion that selectively transmits an electromagnetic wave having a specific wavelength range is formed, and a third conductive layer that is disposed to face the first conductive layer at a distance from the first conductive layer and reflects the electromagnetic wave.

It is preferable that the first conductive layer have the selective transmission pattern portion and an outer conductive portion that is disposed outside the selective transmission pattern portion, and the selective transmission pattern portion consist of an inner conductive portion that is electrically insulated from the outer conductive portion.

In addition, the first conductive layer may have the selective transmission pattern portion and an outer conductive portion that is disposed outside the selective transmission pattern portion, and the selective transmission pattern portion may consist of a non-conductive portion.

In addition, it is preferable that the second conductive layer have the selective reflection pattern portion and a non-conductive portion disposed outside the selective reflection pattern portion, and the selective reflection pattern portion may consist of a conductive portion.

It is preferable that a surface electrical resistivity of the conductive layer member be 1000 Ω or less.

It is preferable that a visible light transmittance of the electromagnetic shielding member be 80% or more.

It is preferable that the conductive layer member consist of a metal mesh or an oxide conductor.

It is preferable that the substrate mainly contain any one of a polymethyl methacrylate resin, a polycarbonate resin, an acrylonitrile butadiene styrene resin, or a polyethylene terephthalate resin.

Since the electromagnetic shielding member according to the aspect of the present invention comprises the substrate having the three-dimensional shape and the conductive layer that is disposed on the substrate and selectively reflects the electromagnetic wave having the wavelength in the specific range, the electromagnetic wave can be reflected to the three-dimensional object in a wavelength-selective manner.

DESCRIPTION OF THE PREFERRED EMBODIMENTS

In the following, an electromagnetic shielding member according to an embodiment of the present invention will be described in detail based on the preferred embodiments shown in the accompanying drawings.

It should be noted that the figures shown below are exemplary examples for describing the present invention, and the present invention is not limited to the figures shown below.

It should be noted that, in the following, "to" indicating a numerical range includes the numerical values described on both sides thereof. For example, in a case in which ε is a numerical value α to a numerical value β, a range of ε is a range including the numerical value α and the numerical value β, and it is expressed as α≤ε≤β in mathematical symbols.

Unless otherwise specified, an angle, such as "parallel" and "orthogonal", include an error range generally allowed in the corresponding technical field.

In addition, the "same" includes an error range generally allowed in the corresponding technical field.

In addition, "(meth)acrylate" represents both or any of acrylate or methacrylate, and "(meth)acrylic" represents both or any of acrylic or methacrylic. In addition, "(meth)acryloyl" represents both or any of acryloyl or methacryloyl.

It should be noted that, unless otherwise specified, "transparent to visible light" means that a visible light transmittance is 40% or more in a visible light wavelength range of wavelength of 380 nm to 780 nm, preferably 80% or more, and more preferably 90% or more. In addition, in the following description, unless otherwise specified, transparency means that it is transparent to visible light.

The visible light transmittance is measured by using "Plastic-How to determine the total light transmittance and the total light reflectivity" defined in Japanese Industrial Standards (JIS) K 7375: 2008.

First Embodiment

Figure 1:
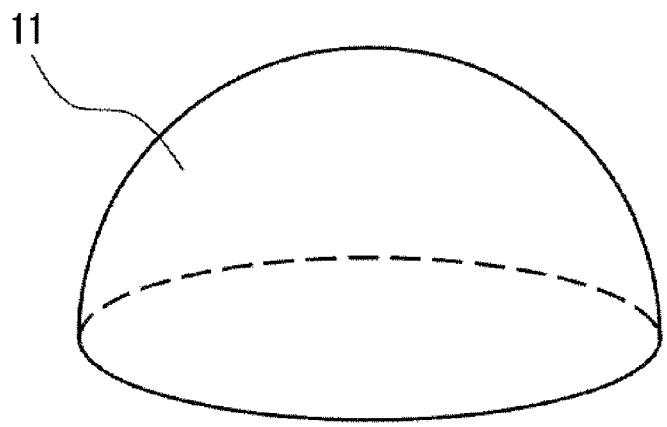
FIG. 1 is a schematic perspective view of an electromagnetic shielding member according to a first embodiment of the present invention.

FIG. 1 shows an electromagnetic shielding member 11 according to a first embodiment of the present invention. The electromagnetic shielding member 11 has a three-dimensional shape along a curved surface of a hemisphere. In addition, the electromagnetic shielding member 11 is integrally formed along the curved surface of the hemisphere, and does not have a joining portion to which a plurality of members are joined by, for example, a silver paste or a pressure sensitive adhesive tape.

Figure 2:
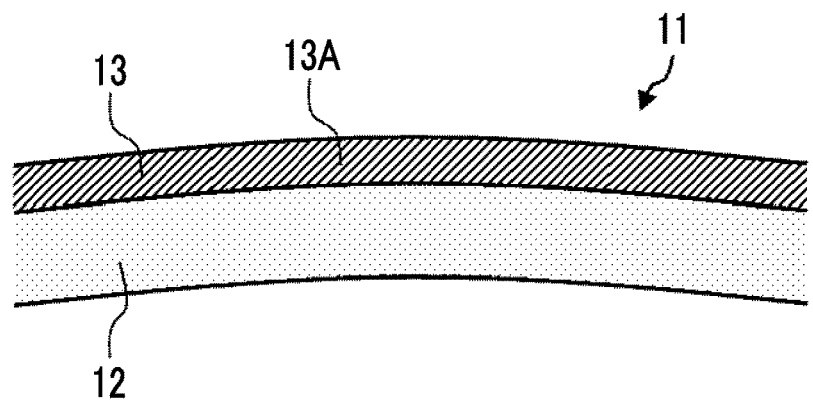
FIG. 2 is a cross-sectional view schematically showing a part of the electromagnetic shielding member according to the first embodiment of the present invention.

As shown in FIG. 2, the electromagnetic shielding member 11 comprises an insulating transparent substrate 12 having a three-dimensional shape along the curved surface of the hemisphere, and a conductive layer member 13 that is disposed on the substrate 12 and reflects the electromagnetic wave in a wavelength-selective manner. Here, to reflect the electromagnetic wave in a wavelength-selective manner means to transmit the electromagnetic wave having a specific wavelength range, that is, a specific frequency band, and reflect other electromagnetic waves, or to reflect the electromagnetic wave having the specific wavelength range, that is, the specific frequency band, and transmit other electromagnetic waves. In addition, the specific frequency band is a frequency band centered on a specific frequency, such as 2.4 GHz, 5.0 GHz, or 76.0 GHz, and is a frequency band determined in accordance with a size of a selective transmission pattern portion described below. In addition, as will be described below, the conductive layer member 13 consists of a first conductive layer 13A on which the selective transmission pattern portion that selectively transmits the electromagnetic wave having the specific wavelength range is formed. In addition, the first conductive layer 13A has a property of transmitting light, and the electromagnetic shielding member 11 consisting of the substrate 12 and the first conductive layer 13A has a visible light transmittance of 80% or more.

Figure 3:
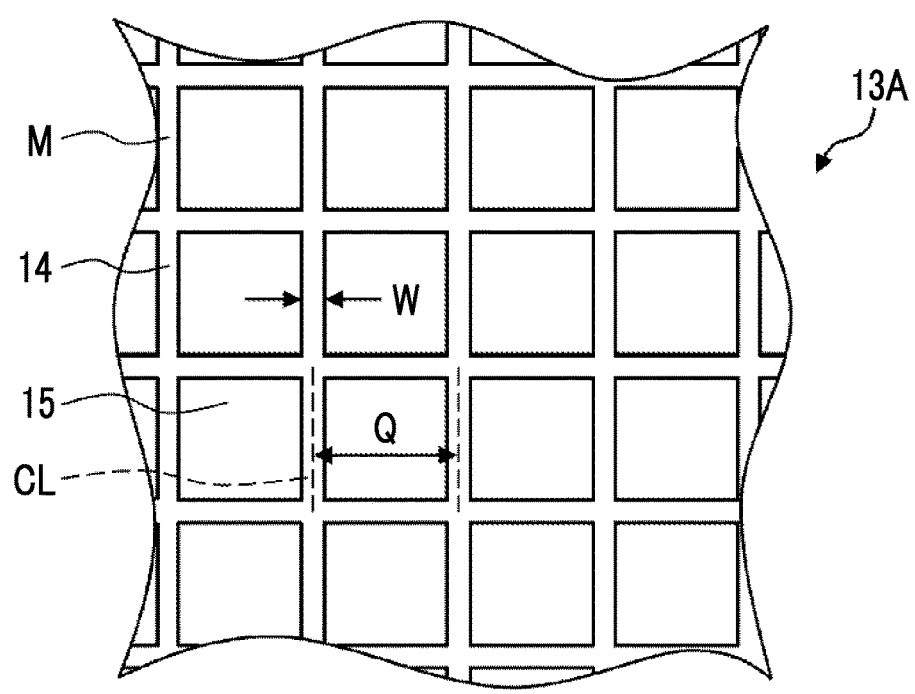
FIG. 3 is an enlarged schematic view showing a part of a conductive layer according to the first embodiment of the present invention.

As shown in FIG. 3, for example, the first conductive layer 13A is composed of a metal mesh M consisting of a fine metal wire 14 having a line width W and having a plurality of square opening portions 15. The fine metal wires 14 parallel to each other and adjacent to each other are disposed at a distance by a pitch Q defined as a distance between virtual center lines CL of the fine metal wires 14. The first conductive layer 13A is integrally formed along the substrate 12, and does not have a joining portion by, for example, the silver paste or as pressure sensitive adhesive tape.

The line width W of the fine metal wire 14 is not particularly limited, but an upper limit thereof is preferably 1000.0 μm or less, more preferably 500.0 μm or less, and still more preferably 300.0 μm or less. A lower limit of the line width W is preferably 2.0 μm or more, and more preferably 5.0 μm or more. In a case in which the line width W is within the range described above, the metal mesh M can have a high conductance. In addition, from the viewpoint of the conductivity, a thickness of the fine metal wire 14 can be set to 0.01 μm or more and 200.00 μm or less, but an upper limit thereof is preferably 30.00 μm or less, more preferably 20.00 μm or less, still more preferably 9.00 μm or less, and particularly preferably 3.00 μm or less. A lower limit of the thickness of the fine metal wire 14 is preferably 0.01 μm or more, and more preferably 0.05 μm or more.

The conductance of the metal mesh M is preferably 1.0 mS or more, and particularly preferably 10.0 mS or more. That is, a surface electrical resistivity of the metal mesh M is preferably 1000 Ω (1000 Ω/□) or less, and particularly preferably 100 Ω (100 Ω/□) or less. As described above, since the metal mesh M has a high conductance, the metal mesh M has a high reflection performance to the electromagnetic wave.

In addition, for example, in a case in which a user tries to visually recognize the scenery through the electromagnetic shielding member 11, in order to make the presence of the metal mesh M be not conspicuous, and make the user visually recognize the scenery through the electromagnetic shielding member 11 without discomfort, an upper limit of the pitch Q is preferably 800 µm or less, more preferably 600 µm or less, and still more preferably 400 µm or less. In addition, a lower limit of the pitch Q is preferably 5 µm or more, more preferably 30 µm or more, and still more preferably 80 µm or more.

In addition, in order to make the electromagnetic shielding member 11 have the visible light transmittance of 80% or more, an opening ratio of the metal mesh M is preferably 85% or more, more preferably 90% or more, and still more preferably 95% or more. Here, the opening ratio of the metal mesh M is a ratio of a transparent portion of a region occupied by the metal mesh M excluding the fine metal wire 14, that is, a ratio of total areas occupied by a plurality of opening portions 15 to the entire area of the metal mesh M.

In addition, an observer of the electromagnetic shielding member 11 recognizes the fine metal wire 14 forming the metal mesh M, that is, a so-called wire visibility is suppressed as the line width W of the fine metal wire 14 is narrower and the pitch Q of the metal mesh M is narrower. From this viewpoint, for example, the pitch Q is preferably 50 µm or more and 1000 µm or less and the line width W is preferably 1 µm or more and 20 µm or less, and the pitch Q is more preferably 50 µm or more and 800 µm or less and the line width W is more preferably 1 µm or more and 15 µm or less.

It should be noted that a shape of the plurality of opening portions 15 of the metal mesh M is not limited to a square, and is, for example, a geometric figure that combines a triangle shape, such as an equilateral triangle shape, an isosceles triangle shape, and a right triangle shape, a quadrilateral shape, such as a square shape, a rectangle shape, a parallelogram shape, a trapezoid shape, a (regular) polygonal shape, such as a (regular) hexagonal shape and a (regular) octagonal shape, a circle, an ellipse, and a star shape.

Figure 4:
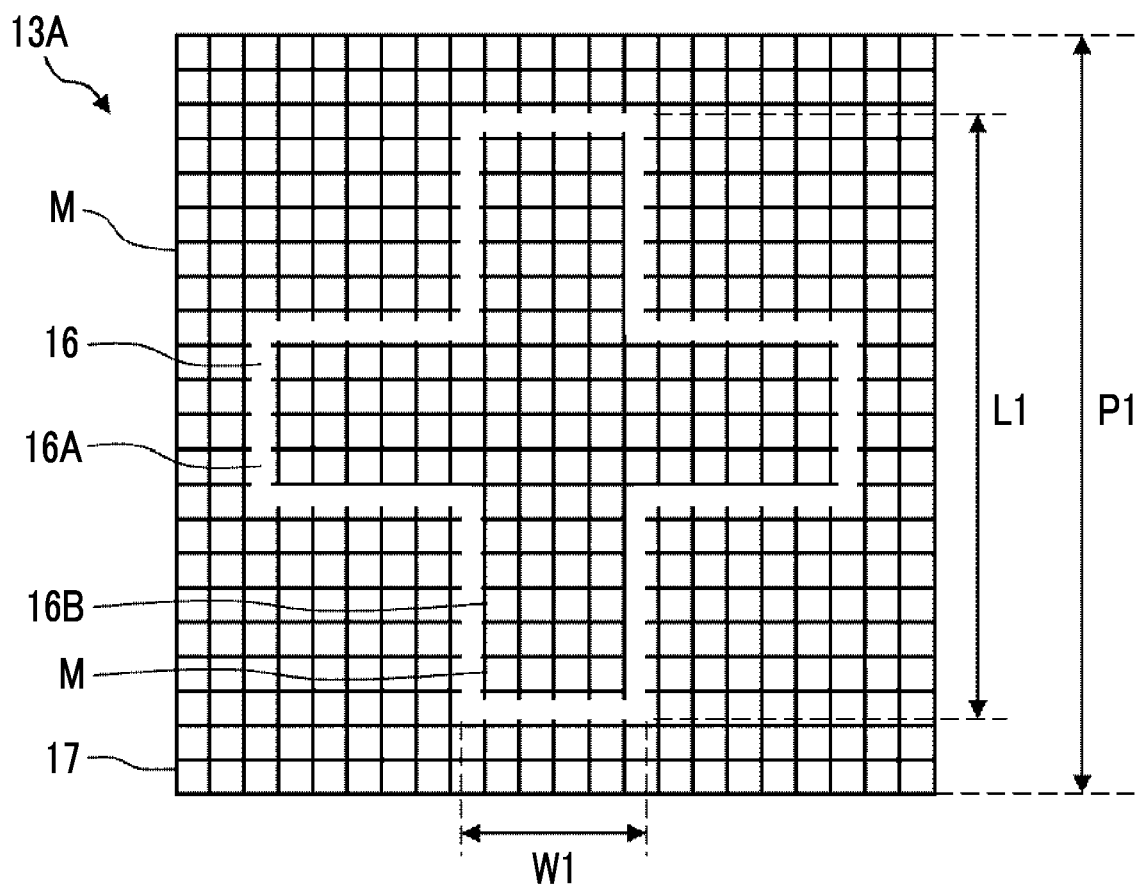
FIG. 4 is a schematic view showing a selective transmission pattern portion according to the first embodiment of the present invention.

As shown in FIG. 4, the first conductive layer 13A has a cross-shaped selective transmission pattern portion 16 that transmits the electromagnetic wave having the specific wavelength range, and an outer conductive portion 17 that consists of the metal mesh M and reflects the electromagnetic wave. The selective transmission pattern portion 16 is a cross-shaped pattern having a width W1 and a length L1 and in which two regions extending in directions orthogonal to each other overlap each other, and is composed of a non-conductive portion 16A in which the metal mesh M is cut out along a contour of the cross-shaped pattern, and an inner conductive portion 16B having a conductivity, which is positioned inside the non-conductive portion 16A and consists of the metal mesh M. The inner conductive portion 16B is electrically insulated from the outer conductive portion 17 due to the presence of the non-conductive portion 16A. By serving as an antenna for the electromagnetic wave having the specific wavelength range, the selective transmission pattern portion 16 can attract the electromagnetic wave having the specific wavelength range and transmit the attracted electromagnetic wave.

In addition, in a case in which the first conductive layer 13A has a plurality of selective transmission pattern portions 16, a plurality of square regions surrounding the selective transmission pattern portion 16 and having a length P1 on each of the four sides are disposed on the first conductive layer 13A without a gap. In each of the plurality of square regions, the selective transmission pattern portion 16 is disposed such that its center matches the center of the square region.

The width W1 and the length L1 of the selective transmission pattern portion 16 and the length P1 of one side of the square region are designed in accordance with the wavelength of the electromagnetic wave to be transmitted through the selective transmission pattern portion 16. For example, the width W1 in the selective transmission pattern portion 16 that transmits the electromagnetic wave having a frequency of 2.4 GHz, which is often used in wireless communication, that is, the electromagnetic wave having a wavelength of about 33.3 cm can be designed to be 1.80 cm, and the length L1 thereof can be designed to be 6.60 cm, and the length P1 of one side of the square region can be designed to be 8.25 cm.

In addition, for example, in a case in which the electromagnetic wave having a frequency of 5.0 GHz, that is, the electromagnetic wave having a wavelength of about 6.0 cm is transmitted, the width W1 is 4.3 mm, the length L1 can be designed to be 25.5 mm, and the length P1 of one side of the square region can be designed to be 29.8 mm.

In addition, for example, in a case in which the electromagnetic wave having a frequency of 76.0 GHz classified as a so-called millimeter wave, that is, the electromagnetic wave having a wavelength of about 3.9 mm is transmitted, the width W1 is 0.13 mm, the length L1 can be designed to be 1.41 mm, and the length P1 of one side of the square region can be designed to be 1.65 mm.

Figure 5:
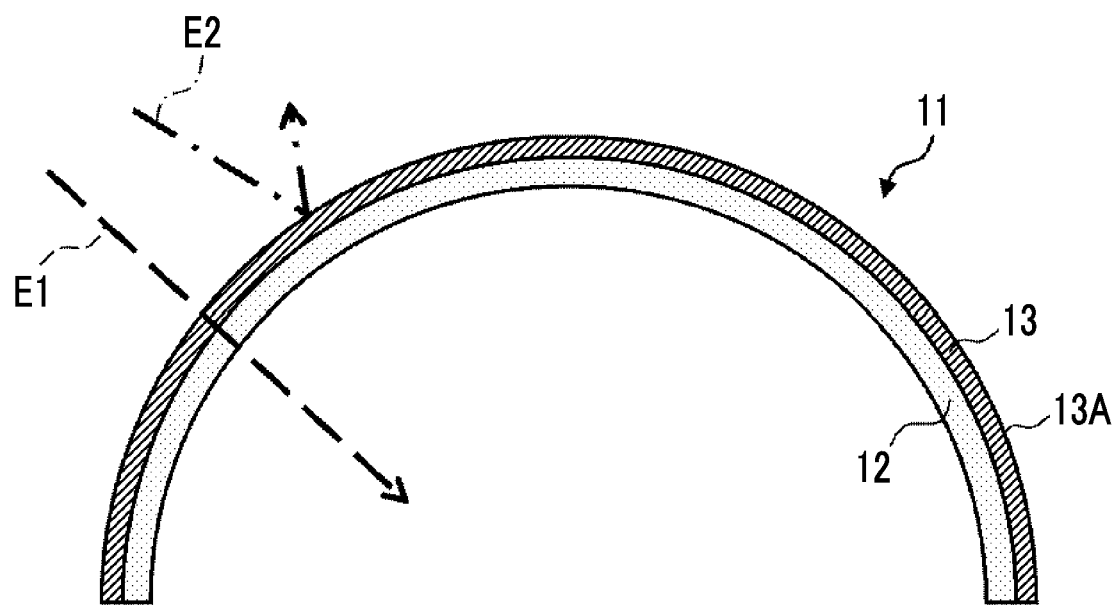
FIG. 5 is a schematic view showing how an electromagnetic wave flies to the electromagnetic shielding member according to the first embodiment of the present invention.

As described above, since the first conductive layer 13A has the selective transmission pattern portion 16 that selectively transmits the electromagnetic wave having the specific wavelength range, as shown in FIG. 5, in a case in which the first conductive layer 13A is disposed outside the hemispherical shape of the substrate 12 and the electromagnetic wave flies from the first conductive layer 13A side, an electromagnetic wave E1 having the specific wavelength range can be selectively transmitted to the inside of the hemispherical shape of the substrate 12, and an electromagnetic wave E2 having the specific wavelength range other than the electromagnetic wave E1 can be selectively reflected to the outside of the hemispherical shape of the substrate 12.

In addition, although not shown, in a case in which the electromagnetic wave is generated in a space on the substrate 12 side, by the electromagnetic shielding member 11, the electromagnetic wave E1 having the specific wavelength range is transmitted to the outside of the hemispherical shape of the substrate 12 and the electromagnetic wave E2 having the specific wavelength range other than the electromagnetic wave E1 is reflected to the inside of the hemispherical shape of the substrate 12.

From the above, with the electromagnetic shielding member 11 according to the first embodiment of the present invention, since the substrate 12 has the three-dimensional shape and the first conductive layer 13A that selectively transmits the electromagnetic wave having the specific wavelength range is disposed on the substrate 12, for example, the electromagnetic shielding member 11 can be disposed along the three-dimensional object having the same three-dimensional shape as the substrate 12, the electromagnetic wave having the specific wavelength range can be selectively incident on the three-dimensional object, and the electromagnetic waves having other specific wavelength ranges can be prevented from being incident. In addition, in a case in which the electromagnetic wave is emitted from the three-dimensional object, the electromagnetic wave having the specific wavelength range can be selectively transmitted to the outside of the electromagnetic shielding member 11, and the electromagnetic waves having other wavelength ranges can be reflected to the inside of the electromagnetic shielding member 11. As described above, the electromagnetic shielding member 11 can reflect the electromagnetic wave to the three-dimensional object in a wavelength-selective manner.

In addition, since the electromagnetic shielding member 11 has the visible light transmittance of 80% or more, for example, even in a case in which the electromagnetic shielding member 11 is attached to the three-dimensional object having a designability while incorporating a plurality of sensors that transmit and receive the electromagnetic wave, such as the emblem of a vehicle that can be driven automatically, the electromagnetic wave having the specific wavelength range can be transmitted and received between the three-dimensional object and the outside of the electromagnetic shielding member 11 without spoiling the designability thereof.

Figure 6:
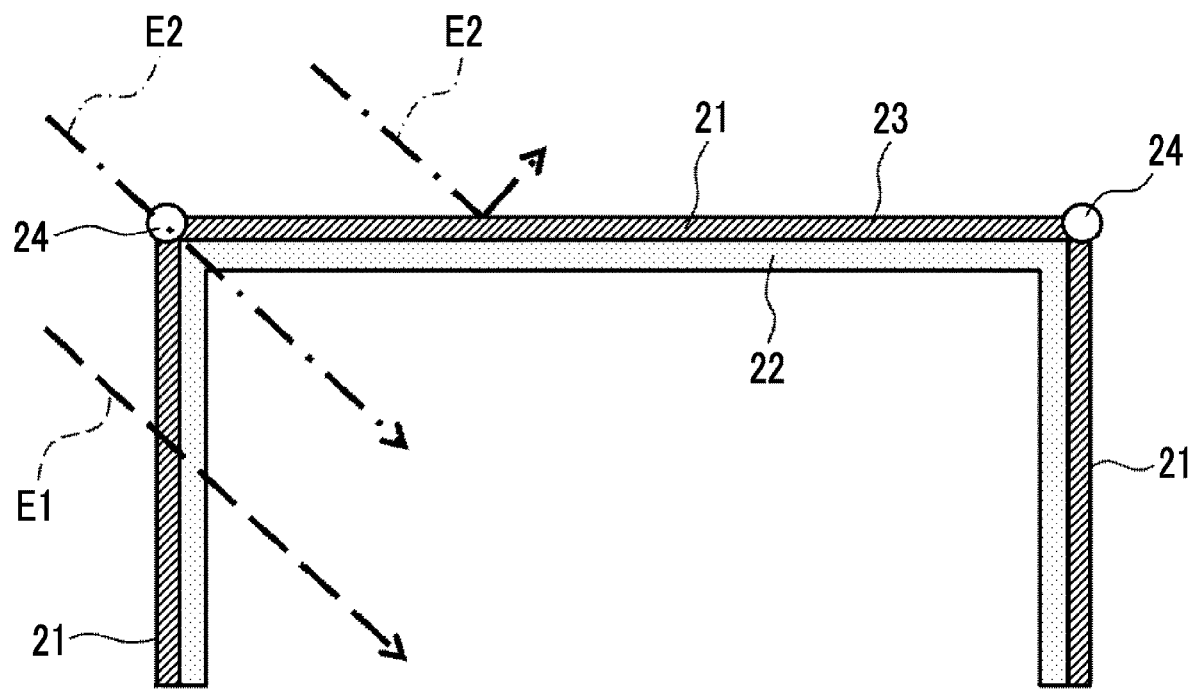
FIG. 6 is a schematic view showing how the electromagnetic wave flies to the electromagnetic shielding member that is assumed to have a joining portion.

Here, for example, as shown in FIG. 6, it is assumed that a plurality of electromagnetic shielding members 21 having a planar shape as disclosed in JP2007-336415A are joined to each other with transparent insulating pressure sensitive adhesive tape or the like to form the three-dimensional shape. Each of the plurality of electromagnetic shielding members 21 has a planar substrate 22 and a conductive layer 23 formed on the substrate 22 similar to the first conductive layer 13A in the first embodiment of the present invention. The plurality of electromagnetic shielding members 21 are joined to each other by a joining portion 24 while maintaining transparency by a transparent insulating pressure sensitive adhesive. The conductive layers 23 of the plurality of electromagnetic shielding members 21, which are joined by the joining portion 24, are electrically connected to each other.

The plurality of electromagnetic shielding members 21 transmit the electromagnetic wave E1 having the specific wavelength range by the conductive layer 23, and reflect the electromagnetic wave E2 having other wavelength ranges. Here, in the joining portion 24 consisting of the transparent pressure sensitive adhesive, it is assumed that a contact resistance between the plurality of conductive layers 23 is high. In such a joining portion 24 having a high contact resistance, that is, the joining portion 24 having a low conductance as compared with the metal mesh M constituting the plurality of conductive layers 23, it is assumed that the electromagnetic wave E2, which should be originally reflected by the conductive layer 23, is transmitted.

On the other hand, since the electromagnetic shielding member 11 according to the embodiment of the present invention comprises the first conductive layer 13A, which is integrally formed and does not have the joining portion 24 by the silver paste or the pressure sensitive adhesive tape, it is possible to prevent the electromagnetic wave E2 other than the electromagnetic wave E1 selectively transmitted by the first conductive layer 13A from being transmitted. As a result, the electromagnetic shielding member 11 can more reliably selectively transmit the electromagnetic wave E1 having the specific wavelength range and reflect the electromagnetic wave having other wavelength ranges.

It should be noted that, although the first conductive layer 13A is disposed on an outer surface of the hemispherical shape on both surfaces of the substrate 12, the first conductive layer 13A can also be disposed on an inner surface of the hemispherical shape. In addition, the first conductive layer 13A can be disposed on each of both surfaces of the substrate 12.

In addition, the substrate 12 has the three-dimensional shape along the curved surface of the hemisphere, but is not limited to the shape along the curved surface of the hemisphere as long as it has the three-dimensional shape. Although not shown, the substrate 12 can have any three-dimensional shape whose shape is maintained independently, such as a cube shape, a rectangular parallelepiped shape, a polyhedral shape, a cylindrical shape, a polygonal prism shape, a conical shape, and a polygonal pyramid shape.

In addition, the first conductive layer 13A is composed of the metal mesh M, but the material is not limited to the metal mesh M as long as the visible light transmittance is at least 80% or more and the conductivity is provided. For example, the first conductive layer 13A can also consist of a transparent oxide conductor, such as indium tin oxide (ITO). In this case, a conductance of the oxide conductor is preferably 1.0 mS or more, and particularly preferably 10.0 mS or more, similar to the conductance of the metal mesh M. That is, a surface electrical resistivity of the oxide conductor is preferably 1000 Ω (1000 Ω/☐) or less, and particularly preferably 100 Ω (100 Ω/☐) or less.

Figure 7:
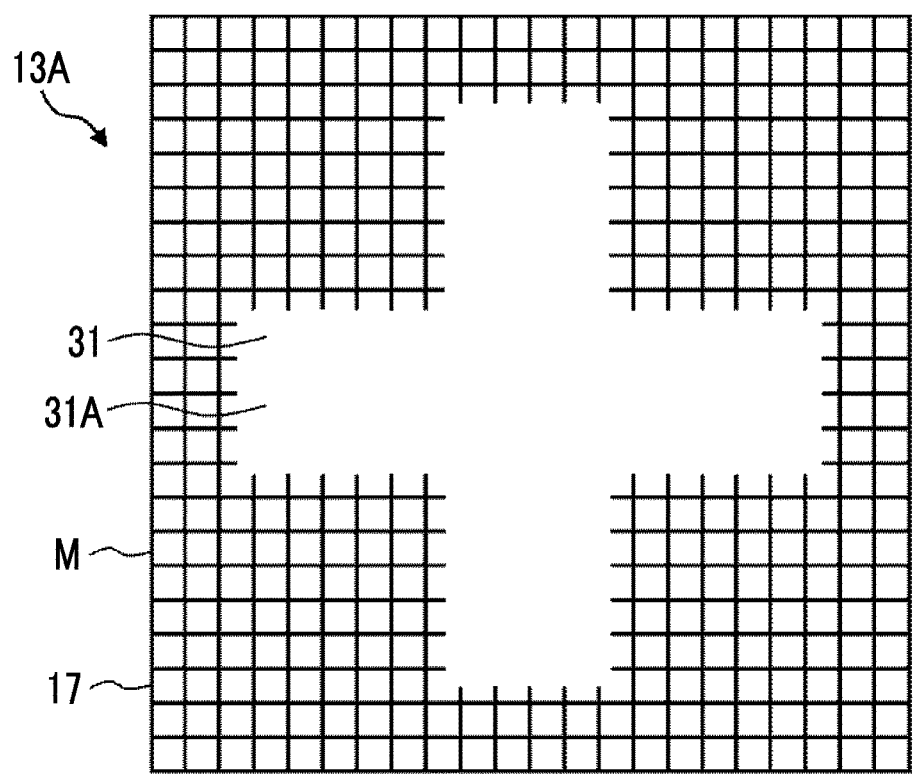
FIG. 7 is a schematic view showing a first modification example of the selective transmission pattern portion according to the first embodiment of the present invention.

In addition, as shown in FIG. 4, the first conductive layer 13A has the selective transmission pattern portion 16 consisting of the non-conductive portion 16A and the inner conductive portion 16B. However, for example, as shown in FIG. 7, the first conductive layer 13A can have a selective transmission pattern portion 31 consisting of only a non-conductive portion 31A in which the metal mesh M is cut out into a cross-shape. Similar to the selective transmission pattern portion 16 shown in FIG. 4, the selective transmission pattern portion 31 can also selectively transmit the electromagnetic wave having the specific wavelength range.

In addition, although not shown, the region having a high resistance value has a low ability to reflect the electromagnetic wave and easily transmits the electromagnetic wave. Therefore, the selective transmission pattern portion can be formed by providing a high resistance portion having a high resistance value compared with the metal mesh M, such as oxidizing the metal mesh M into the cross-shape instead of the non-conductive portions 16A and 31A in which the metal mesh M is cut out.

In addition, it has been described that the first conductive layer 13A has the cross-shaped selective transmission pattern portions 16 and 31, but the shape of the selective transmission pattern portion is not limited to the cross-shape.

Figure 8:
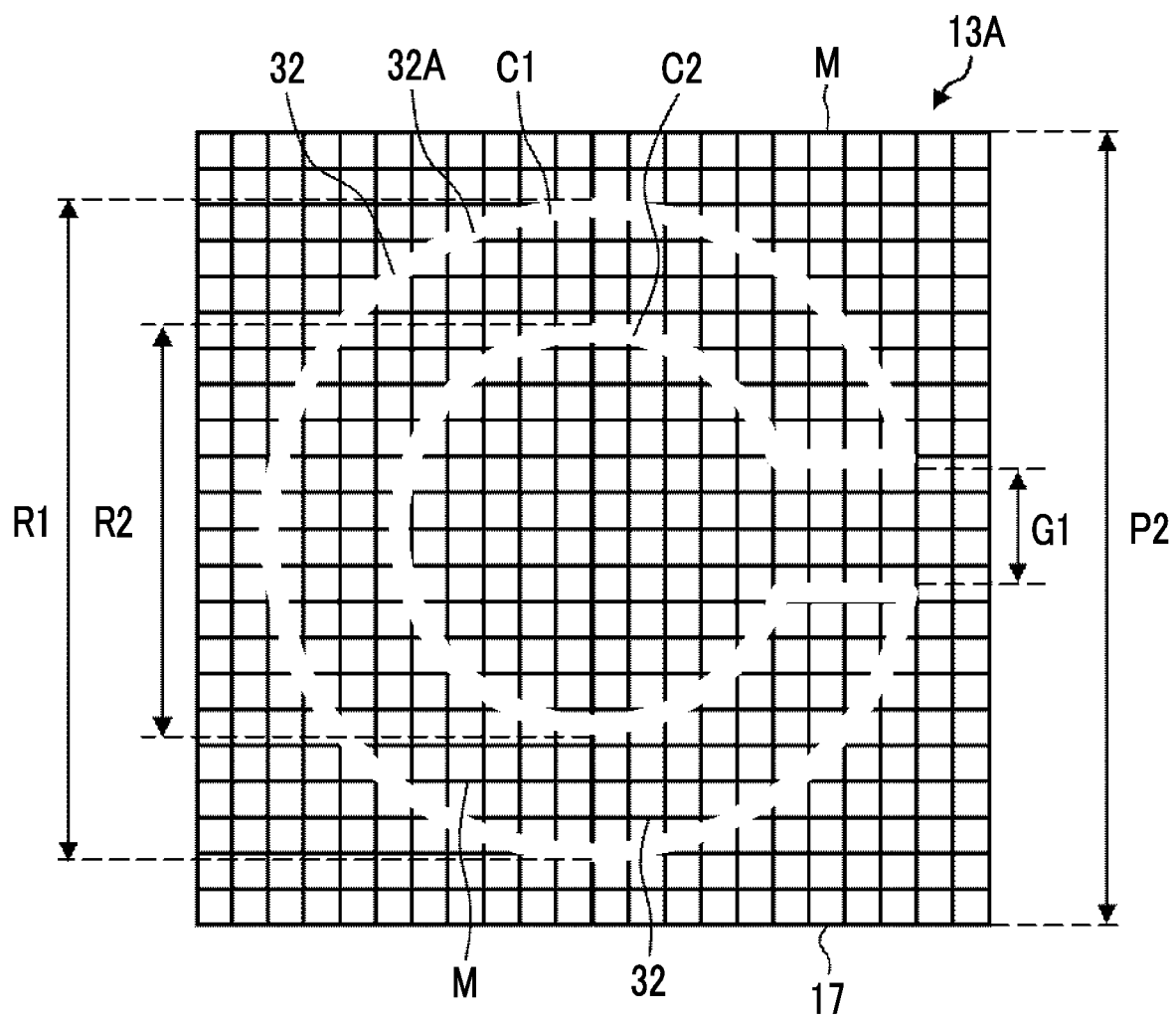
FIG. 8 is a schematic view showing a second modification example of the selective transmission pattern portion according to the first embodiment of the present invention.

For example, as shown in FIG. 8, the first conductive layer 13A can also have a so-called C-shaped selective transmission pattern portion 32. The selective transmission pattern portion 32 is composed of a non-conductive portion 32A in which the metal mesh M is cut out along a C-shaped contour, and an inner conductive portion 32B having the conductivity, which is positioned inside the non-conductive portion 32A and consists of the metal mesh M. The non-conductive portion 32A is formed along a circumference portion of two concentric circles partially chipped at a distance G1, and an outer circumference portion C1 has a diameter R1 and an inner circumference portion C2 has a diameter R2. Similar to the selective transmission pattern portions 16 and 31, the selective transmission pattern portion 32 can selectively transmit the electromagnetic wave having the specific wavelength range.

In addition, in a case in which the first conductive layer 13A has a plurality of selective transmission pattern portions 32, a plurality of square regions surrounding the selective transmission pattern portion 32 and having a length P2 on each of the four sides are disposed on the first conductive layer 13A. In this square region, the selective transmission pattern portion 32 is disposed such that the centers of the two circumference portions C1 and C2 match the center of the square region.

The diameter R1 of the outer circumference portion C1, the diameter R2 of the inner circumference portion C2, the distance G1, and the length P2 of one side of the square region are designed in accordance with the wavelength of the electromagnetic wave to be transmitted through the selective transmission pattern portion 32.

For example, in a case in which the electromagnetic wave having a frequency of 28 GHz, that is, the electromagnetic wave having a wavelength of about 1.1 cm is selectively transmitted, the diameter R1 of the outer circumference portion C1 can be designed to be 1.42 mm, the diameter R2 of the inner circumference portion C2 can be designed to be 1.00 mm, the distance G1 can be designed to be 0.14 mm, and the length P2 of one side of the square region can be designed to be 2.14 mm.

Figure 9:
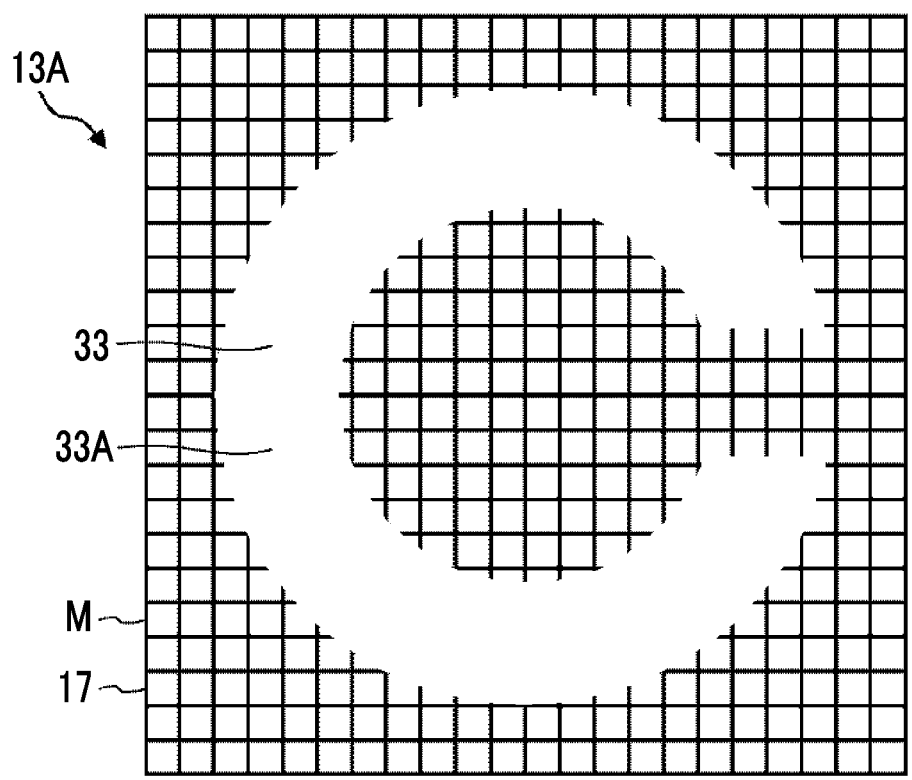
FIG. 9 is a schematic view showing a third modification example of the selective transmission pattern portion according to the first embodiment of the present invention.

In addition, for example, as shown in FIG. 9, the first conductive layer 13A can have a selective transmission pattern portion 33 consisting of a C-shaped non-conductive portion 33A. Similar to the selective transmission pattern portions 16, 31, and 32, the selective transmission pattern portion 33 can also selectively transmit the electromagnetic wave having the specific wavelength range.

In addition, although not shown, the selective transmission pattern portion can be formed by providing a high resistance portion having a high resistance value compared with the metal mesh M, such as oxidizing the metal mesh M into the C-shape instead of the non-conductive portions 32A and 33A in which the C-shaped metal mesh M is cut out.

Second Embodiment

In the first embodiment, the conductive layer member 13 is composed of the first conductive layer 13A on which the selective transmission pattern portion 16 is formed, but the conductive layer member 13 can also be composed of a second conductive layer on which the selective reflection pattern portion that selectively reflects the electromagnetic wave having the specific wavelength range is formed.

Figure 10:
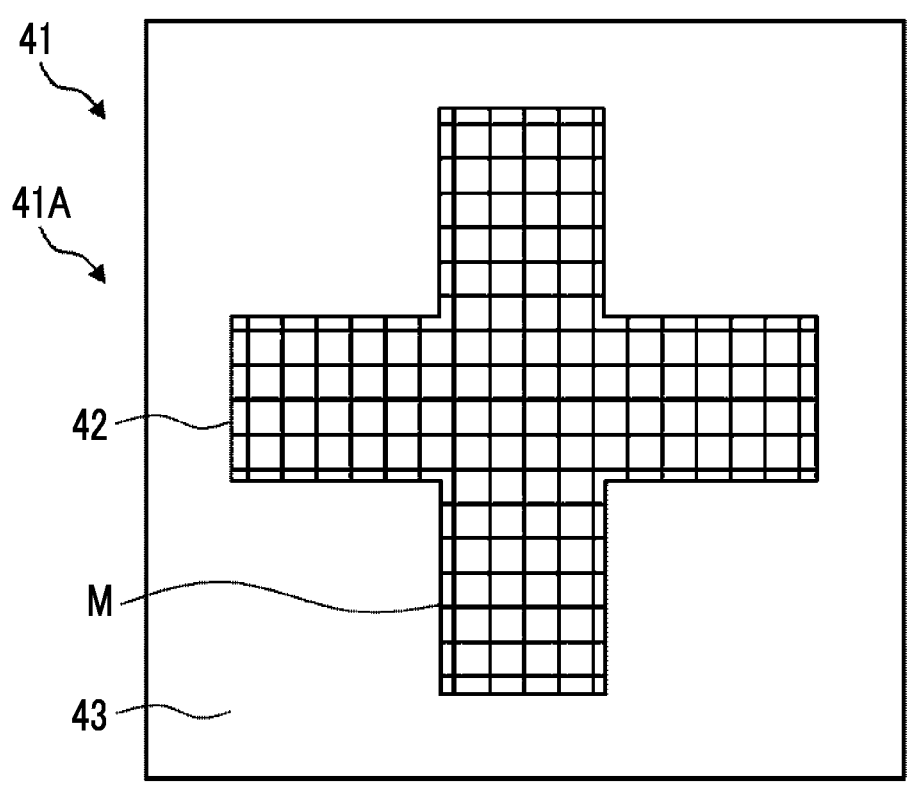
FIG. 10 is a schematic view showing a selective reflection pattern portion according to a second embodiment of the present invention.

The electromagnetic shielding member according to the second embodiment comprises a conductive layer member 41 as shown in FIG. 10 instead of the conductive layer member 13 in the electromagnetic shielding member 11 according to the first embodiment. The conductive layer member 41 according to the second embodiment consists of a second conductive layer 41A consisting of the metal mesh M and on which a cross-shaped selective reflection pattern portion 42 is formed. The second conductive layer 41A consists of the selective reflection pattern portion 42 and a non-conductive portion 43 disposed outside the selective reflection pattern portion 42 in which the metal mesh M is not present. The selective reflection pattern portion 42 can attract the electromagnetic wave and reflect the attracted electromagnetic wave by acting as the antenna for the electromagnetic wave having the specific wavelength range. Therefore, the second conductive layer 41A can selectively reflect the electromagnetic wave having the specific wavelength range and transmit other electromagnetic waves.

As described above, with the electromagnetic shielding member according to the second embodiment of the present invention, since the substrate 12 has the three-dimensional shape and the second conductive layer 41A that selectively reflects the electromagnetic wave having the specific wavelength range is disposed on the substrate 12, the electromagnetic wave can be reflected to the three-dimensional object in a wavelength-selective manner.

In addition, since the second conductive layer 41A does not have the joining portion 24 by the silver paste or the pressure sensitive adhesive tape, the electromagnetic wave having the specific wavelength range can be more reliably reflected while having transparency.

It should be noted that, it has been described that the second conductive layer 41A consists of the selective reflection pattern portion 42 and the non-conductive portion 43 in which the metal mesh M is not present. However, as the non-conductive portion 43, the second conductive layer 41A can further comprise a high resistance portion that is disposed along an outer edge portion of the selective reflection pattern portion 42, has the same mesh shape as the metal mesh M, and has a high resistance value than the metal mesh M. Such a high resistance portion can be formed, for example, by oxidizing the metal mesh M formed over the entire one side of the substrate 12 excluding the region in which the selective reflection pattern portion 42 is formed from the metal mesh M.

In addition, although the selective reflection pattern portion 42 consists of the metal mesh M, for example, instead of the metal mesh M, the selective reflection pattern portion 42 can consist of a conductive portion composed of the transparent oxide conductor, such as ITO.

Figure 11:
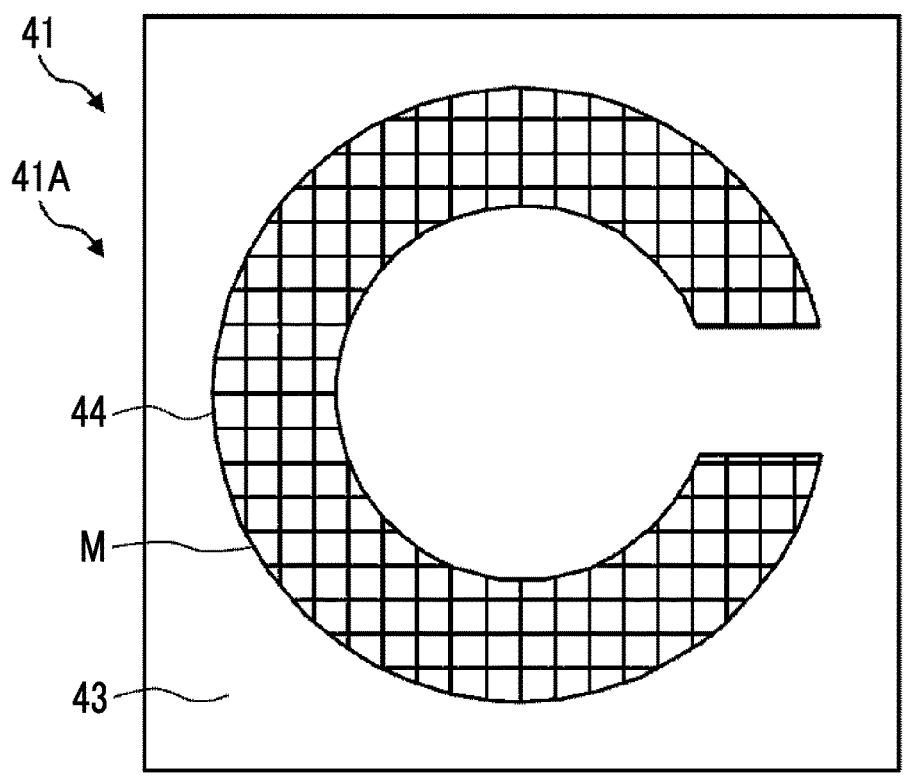
FIG. 11 is a schematic view showing a modification example of the selective reflection pattern portion according to the second embodiment of the present invention.

In addition, although the second conductive layer 41A according to the second embodiment has the cross-shaped selective reflection pattern portion 42, the second conductive layer 41A can also have the C-shaped selective reflection pattern portion 44 as shown in FIG. 11. Even in this case, the electromagnetic shielding member can reflect the electromagnetic wave to the three-dimensional object in a wavelength-selective manner, as in a case in which the second conductive layer 41A has the cross-shaped selective reflection pattern portion 42.

Third Embodiment

Figure 12:
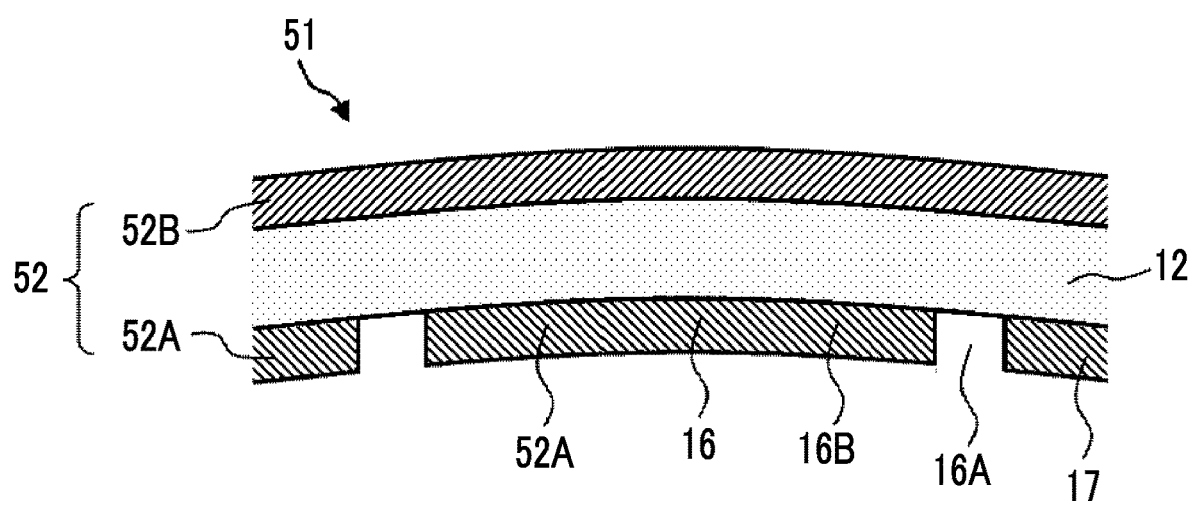
FIG. 12 is a cross-sectional view schematically showing a part of the electromagnetic shielding member according to a third embodiment of the present invention.

The conductive layer member 13 according to the first embodiment consists of the first conductive layer 13A on which the selective transmission pattern portion 16 is formed, but the conductive layer member 13 can further comprise a third conductive layer which is disposed to face the first conductive layer 13A at a distance from the first conductive layer 13A and reflects the electromagnetic wave. As shown in FIG. 12, an electromagnetic shielding member 51 according to the third embodiment of the present invention comprises a conductive layer member 52 instead of the conductive layer member 13 in the electromagnetic shielding member 11 according to the first embodiment. The conductive layer member 52 consists of a first conductive layer 52A that is disposed on one surface of the substrate 12 and is the same as the first conductive layer 13A, and a third conductive layer 52B that is disposed on the other surface of the substrate 12 and reflects the electromagnetic wave.

Figure 13:
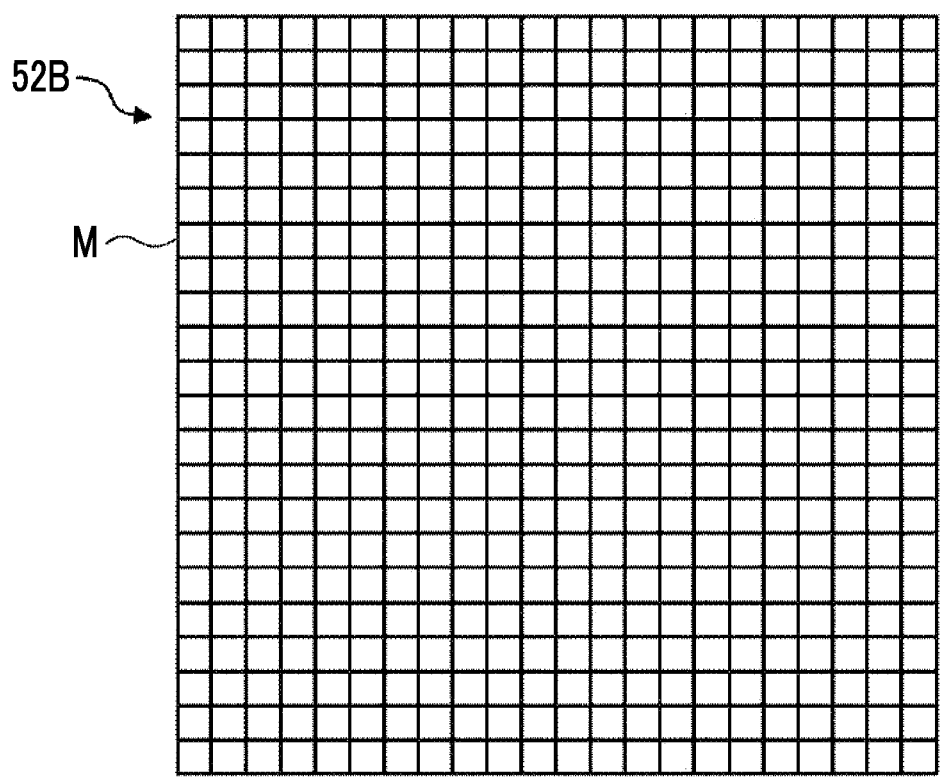
FIG. 13 is a schematic view showing a part of a second conductive layer according to the third embodiment of the present invention.
Figure 14:
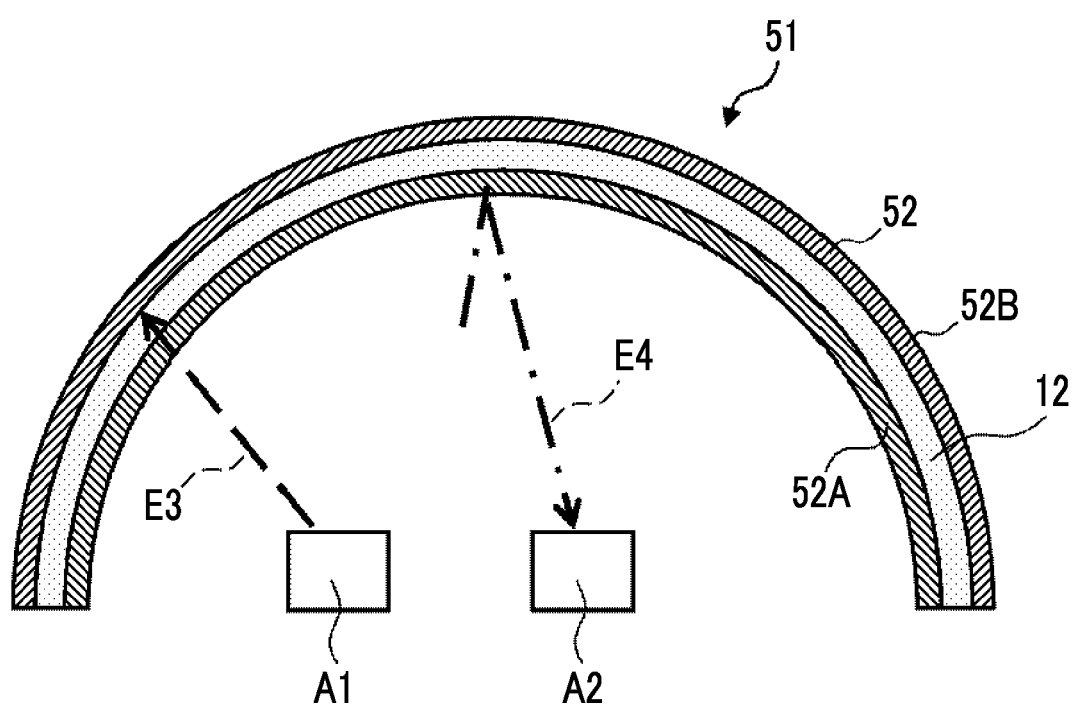
FIG. 14 is a schematic view showing how the electromagnetic shielding member according to the third embodiment of the present invention absorbs the electromagnetic wave having a specific wavelength.

In an example shown in FIG. 12, on the two surfaces of the substrate 12 having a shape along the curved surface of the hemisphere, the first conductive layer 52A having the selective transmission pattern portion 16 is formed on the inner surface of the hemisphere, and the third conductive layer 52B is formed on the outer surface of the hemisphere. As shown in FIG. 13, the third conductive layer 52B does not have the selective transmission pattern portion 16 and consists of the metal mesh M uniformly formed over the entire layer.

The electromagnetic shielding member 51 according to the third embodiment can selectively absorb the electromagnetic wave having the specific wavelength range flying from the first conductive layer 52A side and reflect other electromagnetic waves. For example, in a case in which a noise source A1 that emits the electromagnetic wave E3 that becomes noise and a sensor A2 that receives the electromagnetic wave E4 having specific wavelength are disposed inside the hemispherical shape of the substrate 12, the electromagnetic shielding member 51 can selectively absorb an electromagnetic wave E3 of the noise having the specific wavelength range and reflect other electromagnetic waves, for example, an electromagnetic wave E4 to a space on the third conductive layer 52B side. Therefore, it is possible to reduce the influence of the electromagnetic wave E3 of the noise in the space on the third conductive layer 52B side and prevent the crosstalk of the electromagnetic wave E4 received by the sensor A2 and the electromagnetic wave E3 of the noise.

From the above, with the electromagnetic shielding member 51 according to the third embodiment, since the substrate 12 has the three-dimensional shape and the first conductive layer 52A and the third conductive layer 52B are disposed across the substrate 12, the electromagnetic shielding member 51 can be disposed to cover the three-dimensional object, can selectively absorb only the electromagnetic wave having the specific wavelength, which flies from the first conductive layer 52A side, and reflect other electromagnetic waves. In particular, in a case in which the first conductive layer 52A is disposed inside the three-dimensional shape of the substrate 12 and the third conductive layer 52B is disposed outside the three-dimensional shape of the substrate 12, for example, by the electromagnetic shielding member 51 selectively absorbing the electromagnetic wave of the noise having the specific wavelength, it is possible to reduce the influence of the noise in the space inside the three-dimensional shape of the substrate 12 and perform accurate measurement by using the sensor or the like.

In addition, the third conductive layer 52B is composed of the metal mesh M, but the material is not limited to the metal mesh M as long as the visible light transmittance is at least 80% or more and the conductivity is provided. For example, the third conductive layer 52B can also consist of a transparent oxide conductor, such as ITO. In this case, the conductance of the oxide conductor is preferably 1.0 mS or more, and particularly preferably 10.0 mS or more, similar to the conductance of the metal mesh M. That is, the surface electrical resistivity of the oxide conductor is preferably 1000 Ω (1000 Ω/□) or less, and particularly preferably 100 Ω (100 Ω/□) or less.

In addition, although the description is made that the third embodiment is applied to the first embodiment, the third embodiment can be similarly applied to the second embodiment.

In addition, the electromagnetic shielding members 11 and 51 according to the first to third embodiments of the present invention can be disposed along a more complicated three-dimensional object. Examples of the complicated three-dimensional object include an emblem of a vehicle, a radome of a millimeter-wave radar, a front cover of a millimeter-wave radar, a headlamp cover of a vehicle, an antenna, and a reflector. Since the electromagnetic shield having the three-dimensional shape and reflecting the electromagnetic wave in a wavelength-selective manner can be configured by disposing the electromagnetic shielding members 11 and 51 according to the first to third embodiments of the present invention along the three-dimensional shape, for example, the electromagnetic shield that transmits only the target millimeter wave and blocks other electromagnetic waves that can be the noise can be disposed along the emblem of the vehicle, and the millimeter-wave radar can be mounted inside the emblem.

In addition, since the electromagnetic shielding members 11 and 51 according to the first to third embodiments of the present invention are conductors, the electromagnetic shielding members 11 and 51 can be heated by pouring an electric current. As a result, the electromagnetic shielding members 11 and 51 can have a heater function in addition to functioning as an electromagnetic shield that reflects the electromagnetic wave in a wavelength-selective manner. For example, since snow or ice is known to interfere with the transmission and reception and the reflection of electromagnetic wave, in a case in which the electromagnetic shielding members 11 and 51 are disposed in the emblem of the vehicle, the radome of the millimeter-wave radar, the front cover of the millimeter-wave radar, the headlamp cover of the vehicle, the antenna, and the reflector, even in a case in which fallen snow or icing occurs, the electromagnetic shielding members 11 and 51 can melt the snow or ice accumulated in the vehicle and normally transmit and receive and reflect the target electromagnetic wave.

As described above, in a case in which the electromagnetic shielding members 11 and 51 are also used as heaters, the surface electrical resistivity of the metal mesh M in the electromagnetic shielding members 11 and 51 is preferably 20 Ω/□ or less, and more preferably 5 Ω/□ or less from the viewpoint of the heat generation efficiency with respect to a voltage. In addition, the surface electrical resistivity of the metal mesh M is preferably 0.01 Ω/□ or more from the viewpoint of the heat generation efficiency with respect to a current.

In the following, each member of the electromagnetic shielding members 11 and 51 will be described in detail.

<Substrate>

The substrate 12 is not particularly limited as long as the substrate has insulating properties and can support at least any of the conductive layer members 13, 41, and 52, but it is preferably transparent, and preferably made of a resin material.

Specific examples of the resin material constituting the substrate 12 include polymethyl methacrylate (PMMA), polycarbonate (PC), acrylonitrile butadiene styrene (ABS), polyethylene terephthalate (PET), polycycloolefin, (meth) acrylic, polyethylene naphthalate (PEN), polyethylene (PE), polypropylene (PP), polystyrene (PS), polyvinyl chloride (PVC), polyvinylidene chloride (PVDC), polyvinylidene difluoride (PVDF), polyarylate (PAR), polyethersulfone (PES), polymer acrylic, fluorene derivative, cyclo olefin polymer (COP), and triacetylcellulose (TAC).

Here, from the viewpoints of the transparency and the durability of the substrate, it is preferable that the substrate 12 mainly contain any one of a polymethyl methacrylate resin, a polycarbonate resin, an acrylonitrile butadiene styrene resin, or a polyethylene terephthalate resin. Here, the main component of the substrate 12 means that the component occupies 80% or more of the constituent components of the substrate 12.

The visible light transmittance of the substrate 12 is preferably 85% to 100%.

In addition, a thickness of the substrate 12 is not particularly limited, but is preferably 0.05 mm or more and 2.00 mm or less, and more preferably 0.10 mm or more and 1.00 mm or less, from the viewpoint of the handleability and the like.

<Fine Metal Wire>

The type of metal constituting the fine metal wire 14 is not particularly limited, and examples thereof include copper, silver, aluminum, chromium, lead, nickel, gold, tin, and zinc, but copper, silver, and aluminum are more preferable from the viewpoint of the conductivity.

In addition, in a case in which the electromagnetic shielding members 11 and 51 are used as heaters, the voltage is applied to the fine metal wires 14, in this case, in order to suppress a short circuit between the fine metal wires 14 due to migration such as so-called ion migration and electromigration, the type of the metal constituting the fine metal wire 14 is preferably copper due to the reason why the migrations are relatively unlikely to occur.

EXAMPLES

In the following, the present invention will be described in more detail based on examples. The materials, amounts, ratios, processing contents, processing procedures, and the like shown in the following examples can be appropriately changed without deviating from the gist of the present invention, and it should not be interpreted that the scope of the present invention is limited by the following examples.

Example 1

(Preparation of Composition for Forming Primer Layer)

The following components were mixed to obtain a composition for forming a primer layer.
  Z913-3 (manufactured by Aica Kogyo Co., Ltd.) 33 parts by mass
  Isopropyl alcohol (IPA) 67 parts by mass (Formation of Primer Layer)

The obtained composition for forming the primer layer was bar-coated on a polycarbonate resin film (manufactured by TEIJIN LIMITED., Panlite PC-2151) having a thickness of 250 μm to have an average dry film thickness of 1.0 μm, and dried at 80° C. for 3 minutes. Thereafter, the formed layer of the composition for forming the primer layer was irradiated with ultraviolet rays (UV) at an irradiation amount of 1000 mJ to form the primer layer having a thickness of 0.8 μm.

(Preparation of Composition for Forming Plated Layer Precursor Layer)

The following components were mixed to obtain a composition for forming a plated layer precursor layer.
  Isopropyl alcohol (IPA) 38.00 parts by mass
  Polybutadiene maleic acid 4.00 parts by mass
  FAM-401 (manufactured by FUJIFILM Corporation) 1.00 parts by mass
  IRGACURE OXE02 (manufactured by BASF, ClogP=6.55) 0.05 parts by mass (Production of Substrate with Plated Layer Precursor Layer)

The obtained composition for forming the plated layer precursor layer was bar-coated on the primer layer to have a film thickness of 0.2 μm, and dried in an atmosphere of 120° C. for 1 minute. Thereafter, immediately, a polypropylene film having a thickness of 12 μm was bonded onto the composition for forming the plated layer precursor layer to produce a substrate with the plated layer precursor layer.

(Production of Substrate with Plated Layer)

A film mask having an exposure pattern corresponding to the metal mesh M shown in FIG. 3 and the selective transmission pattern portion 16 shown in FIG. 4 was disposed on the substrate with the plated layer precursor layer, and the substrate with the plated layer precursor layer was irradiated with ultraviolet rays (energy amount 200 mJ/cm$^2$, wavelength 365 μm) through the film mask. Next, the substrate with the plated layer precursor layer after being irradiated with ultraviolet rays was developed by a pure shower for 5 minutes to produce a substrate with a plated layer.

Here, the line width of the exposure pattern of the film mask corresponding to the metal mesh M was 4 μm, the pitch Q was 165 μm, the width W1 in the selective transmission pattern portion 16 was 1.80 cm, and the length L1 was 6.60 cm. The selective transmission pattern portion 16 corresponding to the exposure pattern of the film mask was for selectively transmitting the electromagnetic wave having a frequency of 2.4 GHz, that is, a wavelength of about 3.3 cm.

(Three-Dimensional Forming)

The substrate with the plated layer was disposed on a forming jig having a plurality of through-holes for evacuation, and the substrate with the plated layer was heated until a temperature of the substrate with the plated layer reached about 160° C. Further, by evacuating the forming jig in a case in which the temperature of the substrate with the plated layer reached about 160° C., the substrate with the plated layer was brought into close contact with the forming jig, and the substrate with the plated layer was three-dimensionally formed into a shape along the curved surface of the hemisphere as shown in FIG. 1.

(Formation of Conductive Layer)

The three-dimensionally formed substrate with the plated layer was immersed in 1% by mass of sodium hydrogen carbonate aqueous solution at 35° C. for 5 minutes. Next, the substrate with the plated layer was immersed in a palladium catalyst-imparting liquid RONAMERSE SMT (manufactured by Rohm and Haas Electronic Materials LLC) at 55° C. The substrate with the plated layer was washed with water, then immersed in CIRCUPOSIT 6540 (manufactured by Rohm and Haas Electronic Materials LLC) at 35° C. for 5 minutes, and then washed again with water. Further, the substrate with the plated layer was immersed in CIRCUPOSIT4500 (manufactured by Rohm and Haas Electronic Materials LLC) at 45° C. for 20 minutes, then washed with water to form the conductive layer similar to the first conductive layer 13A according to the first embodiment having the copper metal mesh M and the selective transmission pattern portion 16 formed on the polycarbonate resin film. The line width W of the metal mesh M in the obtained conductive layer was 10 μm, and the pitch Q was 165 μm.

As described above, the electromagnetic shielding member of Example 1 was obtained.

Example 2

The electromagnetic shielding member was produced in the same manner as in Example 1 except that the width W1 of the selective transmission pattern portion 16 was 4.3 mm and the length L1 was 25.5 mm. The selective transmission pattern portion 16 was for selectively transmitting the electromagnetic wave having a frequency of 5.0 GHz, that is, a wavelength of about 6.0 cm.

Example 3

The electromagnetic shielding member was produced in the same manner as in Example 1 except that the width W1 of the selective transmission pattern portion 16 was 0.13 mm and the length L1 was 1.41 mm, and the time of immersion in the CIRCUPOSIT 4500 at 45 degrees was 10 minutes. The selective transmission pattern portion 16 was for selectively transmitting the electromagnetic wave having a frequency of 76.0 GHz, that is, a wavelength of about 3.9 mm. The line width W of the metal mesh M of the obtained electromagnetic shielding member was 10 μm.

Example 4

In Example 1, the step of "formation of the conductive layer" was performed on the five planar substrates with the plated layer instead of three-dimensionally forming the substrate with the plated layer, and end portions of the obtained five planar electromagnetic shielding members were joined to each other by copper tape to obtain a box-shaped electromagnetic shielding member that opens in one direction as shown in FIG. 6.

Example 5

In Example 2, the step of "formation of the conductive layer" was performed on the five planar substrates with the plated layer instead of three-dimensionally forming the substrate with the plated layer, and end portions of the obtained five planar electromagnetic shielding members were joined to each other by the copper tape to obtain a box-shaped electromagnetic shielding member that opens in one direction as shown in FIG. 6.

Comparative Example 1

The electromagnetic shielding member was produced in the same manner as in Example 1 except that the conductive layer did not have the selective transmission pattern portion 16 and was composed only of the metal mesh M.

Comparative Example 2

In Example 4, a transparent insulating tape was used instead of the copper tape to join the five planar electromagnetic shielding members to each other to obtain the box-shaped electromagnetic shielding member that opens in one direction as shown in FIG. 6.

Comparative Example 3

The box-shaped electromagnetic shielding member that opens in one direction as shown in FIG. 6 was obtained in the same manner as Comparative Example 2 except that the conductive layer did not have the selective transmission pattern portion 16 and was composed of only the metal mesh M.

Comparative Example 4

In Example 5, the transparent insulating tape was used instead of the copper tape to join the five planar electromagnetic shielding members to each other to obtain the box-shaped electromagnetic shielding member that opens in one direction as shown in FIG. 6.

A shielding ability shown below was evaluated for the electromagnetic shielding members of Examples 1 to 5 and Comparative Examples 1 to 4 obtained as described above.
(Evaluation of Shielding Ability)

Sensors that detect the intensity of the electromagnetic wave were disposed on the outside and inside of the three-dimensional shapes of the electromagnetic shielding members of Examples 1 to 5, and Comparative Examples 1 to 4, and the electromagnetic shielding members were irradiated with the electromagnetic wave having a frequency of 2.4 GHz, the electromagnetic wave having a frequency of 5.0 GHz, and the electromagnetic wave having a frequency of 76.0 GHz from the outside of the three-dimensional shapes of the electromagnetic shielding members. Thereafter, based on the intensity of the electromagnetic waves of 2.4 GHz, 5.0 GHz, and 76.0 GHz detected by the sensors disposed on the outside and inside of the three-dimensional shapes of the electromagnetic shielding members, the attenuation factors by the electromagnetic waves generated by the electromagnetic shielding members were calculated.

Based on the attenuation factors of the electromagnetic wave of 2.4 GHz and the electromagnetic waves of 5.0 GHz and 76.0 GHz calculated in this way, the shielding abilities of the electromagnetic shielding members of Examples 1 to 5 and Comparative Examples 1 to 4 for the electromagnetic waves were evaluated in three stages of A, B, and C based on the following evaluation criteria. Here, the evaluation A indicates that the electromagnetic wave attenuation was small and the electromagnetic shielding member easily transmitted the electromagnetic wave, that is, the electromagnetic shielding member did not have the shielding ability, the evaluation B indicates that the electromagnetic wave attenuation was moderate and the shielding ability of the electromagnetic shielding member was insufficient, and the evaluation C indicates that the electromagnetic wave attenuation was great and it is difficult to transmit the electromagnetic wave, that is, the electromagnetic shielding member had an excellent shielding ability.

A: −5 dB<(attenuation factor)≤0 dB
B: −15 dB<(attenuation factor)≤−5 dB
C: (attenuation factor)≤−15 dB Table 1 below shows the results of evaluation of the shielding ability for Examples 1 to 5 and Comparative Examples 1 to 4.

TABLE 1

| | Presence or absence of selective transmission pattern portion | Joining portion | Evaluation of shielding ability | | | Wavelength of electromagnetic wave particularity transmitted |
|---|---|---|---|---|---|---|
| | | | 2.4 GHz | 5.0 GHz | 76.0 GHz | |
| Example 1 | Presence | Absence | A | C | C | 2.4 GHz |
| Example 2 | Presence | Absence | C | A | C | 5.0 GHz |
| Example 3 | Presence | Absence | C | C | A | 76.0 GHz |
| Example 4 | Presence | Copper tape | A | C | C | 2.4 GHz |
| Example 5 | Presence | Copper tape | C | A | C | 5.0 GHz |
| Comparative Example 1 | Absence | Absence | C | C | C | — |
| Comparative Example 2 | Presence | Insulating tape | A | B | B | — |

TABLE 1-continued

|  | Presence or absence of selective transmission pattern portion | Joining portion | Evaluation of shielding ability | | | Wavelength of electromagnetic wave particularity transmitted |
|---|---|---|---|---|---|---|
|  |  |  | 2.4 GHz | 5.0 GHz | 76.0 GHz |  |
| Comparative Example 3 | Absence | Insulating tape | B | B | B | — |
| Comparative Example 4 | Presence | Insulating tape | B | A | B | — |

As shown in Table 1, it can be seen that the electromagnetic shielding member of Example 1 selectively transmitted only the electromagnetic wave having a frequency of 2.4 GHz among the electromagnetic waves having frequencies of 2.4 GHz, 5.0 GHz, and 76.0 GHz, as the electromagnetic wave having the specific wavelength, and shielded the electromagnetic waves having frequencies of 5.0 GHz and 76.0 GHz.

In addition, it can be seen that the electromagnetic shielding member of Example 2 selectively transmitted only the electromagnetic wave having a frequency of 5.0 GHz among the electromagnetic waves having frequencies of 2.4 GHz, 5.0 GHz, and 76.0 GHz, as the electromagnetic wave having the specific wavelength, and shielded the electromagnetic waves having frequencies of 2.4 GHz and 76.0 GHz.

In addition, it can be seen that the electromagnetic shielding member of Example 3 selectively transmitted only the electromagnetic wave having a frequency of 76.0 GHz among the electromagnetic waves having frequencies of 2.4 GHz, 5.0 GHz, and 76.0 GHz, as the electromagnetic wave having the specific wavelength, and shielded the electromagnetic waves having frequencies of 2.4 GHz and 5.0 GHz.

In addition, it can be seen that the electromagnetic shielding member of Example 4 selectively transmitted only the electromagnetic wave having a frequency of 2.4 GHz among the electromagnetic waves having frequencies of 2.4 GHz, 5.0 GHz, and 76.0 GHz, as the electromagnetic wave having the specific wavelength, and shielded the electromagnetic waves having frequencies of 5.0 GHz and 76.0 GHz, as in Example 1.

In addition, it can be seen that the electromagnetic shielding member of Example 5 selectively transmitted only the electromagnetic wave having a frequency of 2.4 GHz among the electromagnetic waves having frequencies of 2.4 GHz, 5.0 GHz, and 76.0 GHz, as the electromagnetic wave having the specific wavelength, and shielded the electromagnetic waves having frequencies of 5.0 GHz and 76.0 GHz, as in Example 2.

On the other hand, it can be seen that, since the selective transmission pattern portion 16 was not formed on the conductive layer, the electromagnetic shielding member of Comparative Example 1 also shielded the electromagnetic wave having any one frequency of 2.4 GHz, 5.0 GHz, or 76.0 GHz.

In addition, the electromagnetic shielding member of Comparative Example 2 transmitted the electromagnetic wave having a frequency of 2.4 GHz well, but also partially transmitted the electromagnetic waves having frequencies of 5.0 GHz and 76.0 GHz. Therefore, it cannot be said that only the electromagnetic wave having the specific wavelength were selectively transmitted. The reason thereof is presumed that a part of the electromagnetic waves having frequencies of 5.0 GHz and 76.0 GHz, which should be originally shielded, was transmitted at the joining portion in which a plurality of planar electromagnetic shielding members were joined by transparent tape.

In addition, in the electromagnetic shielding member of Comparative Example 3, a part of the electromagnetic waves having all frequencies of 2.4 GHz, 5.0 GHz, and 76.0 GHz was transmitted. It is presumed that, since the selective transmission pattern portion 16 was not formed on the conductive layer in Comparative Example 3, originally, as in Comparative Example 1, the electromagnetic wave having a frequency of 2.4 GHz, the electromagnetic wave having a frequency of 5.0 GHz, and the electromagnetic wave having a frequency of 76.0 GHz should all be shielded, but all electromagnetic waves were transmitted at the joining portion in which the plurality of planar electromagnetic shielding members were joined by transparent tape.

In addition, the electromagnetic shielding member of Comparative Example 4 transmitted the electromagnetic wave having a frequency of 5.0 GHz well, but also partially transmitted the electromagnetic waves having frequencies of 2.4 GHz and 76.0 GHz. Therefore, it cannot be said that only the electromagnetic wave having the specific wavelength were selectively transmitted. The reason thereof is presumed that a part of the electromagnetic waves having frequencies of 2.4 GHz and 76.0 GHz, which should be originally shielded, was transmitted at the joining portion by transparent tape, as in Comparative Example 3.

The transparency was evaluated for the electromagnetic shielding members of Examples 1 to 5 as shown below.

(Evaluation of Transparency)

The transparency of each electromagnetic shielding member was evaluated by the observer visually recognizing the scenery through the electromagnetic shielding members of Examples 1 to 5. Specifically, in a case in which all the scenery through the electromagnetic shielding members of Examples 1 to 5 were visually recognized by the observer without being obstructed, the evaluation was made as having transparency (○). In a case in which there was a part of the scenery through the electromagnetic shielding member that the observer could not visually recognize, such as a case in which a visual field of the observer was obstructed, the evaluation was made as having no transparency (x).

Table 2 below shows the results of the evaluation of the transparency for the electromagnetic shielding members of Examples 1 to 5.

TABLE 2

|  | Joining portion | Evaluation of transparency |
|---|---|---|
| Example 1 | Absence | ○ |
| Example 2 | Absence | ○ |
| Example 3 | Absence | ○ |

TABLE 2-continued

|  | Joining portion | Evaluation of transparency |
|---|---|---|
| Example 4 | Copper tape | x |
| Example 5 | Copper tape | x |

Examples 1 to 3 were evaluated as having transparency, but Examples 4 and 5 were evaluated as having no transparency. As a result, since the electromagnetic shielding members of Examples 1 to 3 did not have the joining portion, the visual field of the observer was not obstructed, but it was considered that the cause of Examples 4 and 5 was that the joining portion by the copper tape obstructed the visual field of the observer.

Example 6

The electromagnetic shielding member was produced in the same manner as in Example 1 except that the line width of the exposure pattern of the film mask corresponding to the metal mesh M was 15 μm and the pitch Q was 330 μm. The line width of the metal mesh M of the obtained electromagnetic shielding member was 21 μm, and the pitch Q was 330 μm.

Example 7

The electromagnetic shielding member was produced in the same manner as in Example 1 except that the line width of the exposure pattern of the film mask corresponding to the metal mesh M was 10 μm and the pitch Q was 1100 μm. The line width of the metal mesh M of the obtained electromagnetic shielding member was 15 μm, and the pitch Q was 1100 μm.

Example 8

The electromagnetic shielding member was produced in the same manner as in Example 1 except that the line width of the exposure pattern of the film mask corresponding to the metal mesh M was 15 μm and the pitch Q was 1100 μm. The line width of the metal mesh M of the obtained electromagnetic shielding member was 21 μm, and the pitch Q was 1100 μm.

The wire visibility was evaluated for the electromagnetic shielding members of Examples 1 and 6 to 8 as shown below.

(Evaluation of Wire Visibility)

For the electromagnetic shielding members of Examples 1 and 6 to 8, the wire visibility of each electromagnetic shielding member was evaluated by whether or not the fine metal wire forming the metal mesh M was visually recognized by the observer. Specifically, for the electromagnetic shielding members of Examples 1 and 6 to 8, a distance between the observer and the electromagnetic shielding member was defined as X, and in a case in which the observer could not visually recognize the fine metal wire forming the metal mesh M, the evaluation was made as "wire invisible", and in a case in which the fine metal wire was visually recognized, the evaluation was made as "wire visible". This evaluation was performed by 10 observers, and the final evaluation results of 4 stages of S, A, B, and C were calculated as follows in accordance with the evaluation results of the 10 observers and the distance X between the observer and the electromagnetic shielding member.

S: 7 or more observers who evaluated "wire invisible" in a case in which X was 10 cm
A: 7 or more observers evaluated "wire invisible" in a case in which X is 30 cm.
B: 7 or more observers who evaluated "wire invisible" in a case in which X is 50 cm
C: 6 or less observers evaluated "wire invisible" in a case in which X is 50 cm Here, the evaluation S indicates that the wire visibility is very unlikely to occur, the evaluation A indicates that the wire visibility is unlikely to occur, and the evaluation B indicates that the wire visibility is moderately suppressed and there is no practical problem, and the evaluation C indicates that wire visibility is likely to occur.

Table 3 below shows the results of the evaluation of the transparency for the electromagnetic shielding members of Examples 1 and 6 to 8.

TABLE 3

|  | Line width W (μm) | Pitch Q (μm) | Evaluation of wire visibility |
|---|---|---|---|
| Example 1 | 10 | 165 | S |
| Example 6 | 21 | 330 | A |
| Example 7 | 15 | 1100 | B |
| Example 8 | 21 | 1100 | C |

The evaluation of the wire visibility of the electromagnetic shielding member of Example 1 was the best in S, the evaluation of the wire visibility of the electromagnetic shielding member of Example 6 was better in A, the evaluation of the wire visibility of the electromagnetic shielding member of Example 7 was good in B, and the evaluation of the wire visibility of the electromagnetic shielding member of Example 8 was worst. From this result, it can be seen that the evaluation of the wire visibility was better as the line width W of the metal mesh M was narrower, and the evaluation of the wire visibility was better as the pitch Q of the metal mesh M was narrower.

In addition, from this result, it can be seen that the wire visibility was suppressed in a case in which the line width W of the metal mesh M was 20 μm or less or the pitch Q was 1000 μm or less.

Example 9

The electromagnetic shielding member was produced in the same manner as in Example 3 except that the conductive layer was disposed inside the hemispherical three-dimensional shape. The obtained electromagnetic shielding member exhibited the same shielding ability and transparency as the electromagnetic shielding member of Example 3. In a case in which the surface electrical resistivity of the metal mesh M of the electromagnetic shielding member of Example 9 was measured, the surface electrical resistivity was 1.0 Ω/□.

Example 10

The electromagnetic shielding member was produced in the same manner as in Example 7 except that the conductive layer was disposed inside the hemispherical three-dimensional shape. The obtained electromagnetic shielding member exhibited the same shielding ability and transparency as the electromagnetic shielding member of Example 7. The surface electrical resistivity of the metal mesh M of the electromagnetic shielding member of Example 10 was 5.5 Ω/□.

Example 11

In the formation of the conductive layer, the electromagnetic shielding member of Example 11 was produced in the same manner as in Example 10 except that it was immersed in CIRCUPOSIT4500 (manufactured by Rohm and Haas Electronic Materials LLC) at 45° C. for only 2 minutes. The line width W of the metal mesh M of the obtained electromagnetic shielding member was 12 μm, and the pitch Q was 1100 μm. In addition, the surface electrical resistivity of the metal mesh M was 21.0 Ω/□.

(Evaluation of Heater Characteristic)

The electromagnetic shielding members of Examples 9 to 11 were disposed in a low temperature chamber maintained at 0° C., and crushed ice imitating snow was laminated, at a thickness of about 5 mm, on the entire surface except for two portions of the outer surface of the three-dimensional shape of the electromagnetic shielding members corresponding to both end portions of the diameter of the hemispherical shape. Thereafter, the temperature in the low temperature chamber was lowered to −20° C., and a conduction portion that electrically connects a device that applies a voltage to the conductive layer and the conductive layer was provided on each of two portions on which the crushed ice was not laminated. In this state, a voltage of 6V was applied between the two conduction portions. The electromagnetic shielding member was evaluated in the following three stages of S, A, and B in accordance with a degree of melting of ice due to the application of voltage.

S: 95% or more of the outer surface of the three-dimensional shape of the electromagnetic shielding member was exposed to the outside 5 minutes after the start of application of voltage A: 95% or more of the outer surface of the three-dimensional shape of the electromagnetic shielding member was exposed to the outside 30 minutes after the start of application of voltage B: It took more than 30 minutes for 95% or more of the outer surface of the three-dimensional shape of the electromagnetic shielding member to be exposed to the outside, or 95% or more of the outer surface of the three-dimensional shape of the electromagnetic shielding member was not exposed to the outside within 180 minutes from the start of application of voltage Table 4 below shows the results of evaluation of the heater characteristics for the electromagnetic shielding members of Examples 9 to 11.

TABLE 4

| | Surface electrical resistivity (Ω/□) | Evaluation of heater characteristic |
|---|---|---|
| Example 9 | 1.0 | S |
| Example 10 | 5.5 | A |
| Example 11 | 21.0 | B |

In the evaluation of the heater characteristic, the electromagnetic shielding member of Example 9 was evaluated as S, the electromagnetic shielding member of Example 10 was evaluated as A, and the electromagnetic shielding member of Example 11 was evaluated as B.

In a case in which the electromagnetic shielding member was observed 5 minutes after the application of voltage is started, the ice laminated on the outer surface of the three-dimensional shape of the electromagnetic shielding member in Example 9 melted, and 95% or more of the outer surface of the three-dimensional shape of the electromagnetic shielding member was exposed to the outside. In Example 10, when 5 minutes elapsed since the application of the voltage was started, the ice laminated on the outer surface of the three-dimensional shape of the electromagnetic shielding member started to melt, but 10% or less of the outer surface of the three-dimensional shape was exposed to the outside. In a case in which the observation was made again after 30 minutes, 95% or more of the outer surface of the three-dimensional shape was exposed to the outside. In addition, in Example 11, even after 180 minutes elapsed since the application of voltage was started, 10% or less of the outer surface of the three-dimensional shape was exposed to the outside.

From this result, it can be seen that the evaluation of the heater characteristic was better as the surface electrical resistivity of the metal mesh M was lower.

From the above, it can be seen that the electromagnetic shielding member according to the embodiment of the present invention as shown in Examples 1 to 5 could reflect the electromagnetic wave to the three-dimensional object in a wavelength-selective manner. In addition, it can be seen that, since the electromagnetic shielding member according to the embodiment of the present invention did not have the insulating joining portion formed by the insulating tape, the electromagnetic waves other than the electromagnetic wave having the specific wavelength to be selectively transmitted could be more reliably shielded.

In addition, it can be seen that, since the electromagnetic shielding member according to the embodiment of the present invention as shown in Examples 1 to 3 did not have the conductive joining portion formed by the copper tape, the electromagnetic shielding member had the transparency without obstructing the visual field of the observer.

In addition, it can be seen that, since the electromagnetic shielding member according to the embodiment of the present invention as shown in Examples 1, 6 and 7 had 20 μm or less of the line width W of the metal mesh M or 1000 μm or less of the pitch Q, the wire visibility was sufficiently suppressed.

In addition, as shown in the evaluation results of the heater characteristics for Examples 9 to 10, it can be seen that the electromagnetic shielding member according to the embodiment of the present invention had the heater characteristic in addition to the function as the electromagnetic shield.

The present invention is basically configured as described above. In the above, the electromagnetic shielding member according to the embodiment of the present invention has been described in detail, but the present invention is not limited to the embodiments described above, and it is needless to say that various improvements or modifications may be made without departing from the gist of the present invention.

EXPLANATION OF REFERENCES 11, 21, 51: electromagnetic shielding member
12, 22: substrate
13, 41, 52: conductive layer member
13A, 52A: first conductive layer
14: fine metal wire
15: opening portion
16, 31, 32, 33: selective transmission pattern portion 16A, 31A, 32A, 33A, 43: non-conductive portion
16B, 32B: inner conductive portion
17: outer conductive portion
23: conductive layer
24: joining portion
41A: second conductive layer
42, 44: selective reflection pattern portion
52B: third conductive layer
A1: noise source
A2: sensor
C1, C2: circumference portion
CL: center line
E1, E2, E3, E4: electromagnetic wave
G1: distance
L1, P1, P2: length
M: metal mesh
Q: pitch
R1, R2: diameter
W: line width
W1: width

What is claimed is:

1. An electromagnetic shielding member comprising:
a substrate having a three-dimensional shape; and
a conductive layer member that is disposed on the substrate and reflects an electromagnetic wave in a wavelength-selective manner,
wherein the conductive layer member includes
a first conductive layer on which a selective transmission pattern portion that selectively transmits an electromagnetic wave having a specific wavelength range is formed, or
a second conductive layer on which a selective reflection pattern portion that selectively reflects an electromagnetic wave having a specific wavelength range is formed.

2. The electromagnetic shielding member according to claim 1,
wherein the first conductive layer has the selective transmission pattern portion and an outer conductive portion that is disposed outside the selective transmission pattern portion, and
the selective transmission pattern portion consists of an inner conductive portion that is electrically insulated from the outer conductive portion.

3. The electromagnetic shielding member according to claim 1,
wherein the first conductive layer has the selective transmission pattern portion and an outer conductive portion that is disposed outside the selective transmission pattern portion, and
the selective transmission pattern portion consists of a non-conductive portion.

4. The electromagnetic shielding member according to claim 1,
wherein the second conductive layer has the selective reflection pattern portion and a non-conductive portion disposed outside the selective reflection pattern portion, and
the selective reflection pattern portion consists of a conductive portion.

5. The electromagnetic shielding member according to claim 1,
wherein a surface electrical resistivity of the conductive layer member is 1000 Ω or less.

6. The electromagnetic shielding member according to claim 2,
wherein a surface electrical resistivity of the conductive layer member is 1000 Ω or less.

7. The electromagnetic shielding member according to claim 1,
wherein a visible light transmittance is 80% or more.

8. The electromagnetic shielding member according to claim 2,
wherein a visible light transmittance is 80% or more.

9. The electromagnetic shielding member according to claim 1,
wherein the conductive layer member consists of a metal mesh or an oxide conductor.

10. The electromagnetic shielding member according to claim 1,
wherein the substrate mainly contains any one of a polymethyl methacrylate resin, a polycarbonate resin, an acrylonitrile butadiene styrene resin, or a polyethylene terephthalate resin.

11. An electromagnetic shielding member comprising:
a substrate having a three-dimensional shape; and
a conductive layer member that is disposed on the substrate and reflects an electromagnetic wave in a wavelength-selective manner,
wherein the conductive layer member consists of
a first conductive layer on which a selective transmission pattern portion that selectively transmits an electromagnetic wave having a specific wavelength range is formed, and
a third conductive layer that is disposed to face the first conductive layer at a distance from the first conductive layer and reflects the electromagnetic wave.

12. The electromagnetic shielding member according to claim 11,
wherein the first conductive layer has the selective transmission pattern portion and an outer conductive portion that is disposed outside the selective transmission pattern portion, and
the selective transmission pattern portion consists of an inner conductive portion that is electrically insulated from the outer conductive portion.

13. The electromagnetic shielding member according to claim 11,
wherein the first conductive layer has the selective transmission pattern portion and an outer conductive portion that is disposed outside the selective transmission pattern portion, and
the selective transmission pattern portion consists of a non-conductive portion.

14. The electromagnetic shielding member according to claim 11,
wherein a surface electrical resistivity of the conductive layer member is 1000 Ω or less.

15. The electromagnetic shielding member according to claim 11,
wherein a visible light transmittance is 80% or more.

16. The electromagnetic shielding member according to claim 11,
wherein the conductive layer member consists of a metal mesh or an oxide conductor.

17. An electromagnetic shielding member comprising:
a substrate having a three-dimensional shape; and
a conductive layer member that is disposed on the substrate and reflects an electromagnetic wave in a wavelength-selective manner,
wherein the conductive layer member consists of a metal mesh.

18. The electromagnetic shielding member according to claim 17,
   wherein a surface electrical resistivity of the conductive layer member is 1000 Ω or less.

19. The electromagnetic shielding member according to claim 17,
   wherein a visible light transmittance is 80% or more.

\* \* \* \* \*